United States Patent
Gilbert et al.

(10) Patent No.: US 7,880,542 B1
(45) Date of Patent: Feb. 1, 2011

(54) INCREMENTAL GAIN AMPLIFIER

(75) Inventors: Barrie Gilbert, Portland, OR (US); John Cowles, Beaverton, OR (US); Todd C. Weigandt, Portland, OR (US)

(73) Assignee: Analog Devices, Inc., Norwood, MA (US)

( * ) Notice: Subject to any disclaimer, the term of this patent is extended or adjusted under 35 U.S.C. 154(b) by 23 days.

(21) Appl. No.: 12/054,192

(22) Filed: Mar. 24, 2008

Related U.S. Application Data

(60) Provisional application No. 60/977,225, filed on Oct. 3, 2007.

(51) Int. Cl.
   *H03G 3/00* (2006.01)
(52) U.S. Cl. .................. 330/127; 330/279
(58) Field of Classification Search ............ 330/84, 330/279, 124 R, 295, 310
   See application file for complete search history.

(56) References Cited

U.S. PATENT DOCUMENTS

| | | | |
|---|---|---|---|
| 5,684,431 A | 11/1997 | Gilbert et al. | |
| 6,069,866 A * | 5/2000 | Pietruszynski et al. | 369/124.11 |
| 6,525,601 B2 | 2/2003 | Gilbert | |
| 6,674,382 B1 | 1/2004 | Jordan | |
| 6,894,564 B1 | 5/2005 | Gilbert | |
| 6,980,051 B2 * | 12/2005 | Ryynanen et al. | 330/254 |
| 7,164,313 B2 * | 1/2007 | Capofreddi et al. | 330/86 |
| 7,190,227 B2 | 3/2007 | Gilbert | |
| 7,298,207 B2 * | 11/2007 | Yim et al. | 330/133 |
| 7,515,891 B2 * | 4/2009 | Darabi | 455/250.1 |
| 2002/0015458 A1 | 2/2002 | Van Sinderen | |
| 2005/0030121 A1 | 2/2005 | Gilbert | |
| 2007/0109053 A1 * | 5/2007 | Langenbach et al. | 330/279 |

OTHER PUBLICATIONS

Gilbert, Barrie, "A New Wide-Band Amplifier Technique", IEEE Journal of Solid-State Circuits, Dec. 1968, pp. 353-365, vol. SC-3, No. 4.
Analog Devices, Inc., "5 V Upstream Cable Line Driver AD8328", 2005, pp. Rev. A 1-20.
Gray, Paul R. and Meyer, Robert G., "3.4 Emitter-Coupled Pairs", Analysis and Design of Analog Integrated Circuits, Third Edition 1993, 2 cover sheets and pp. 227-231.

* cited by examiner

*Primary Examiner*—Hieu P Nguyen
(74) *Attorney, Agent, or Firm*—Marger Johnson & McCollom, PC

(57) ABSTRACT

An amplifier includes an amplifier section having selectable signal paths to provide discrete gain settings, and logic to incrementally select the signal paths. The logic may be configured to increment the gain in response to digital gain control signals or an analog gain control signal. Another amplifier has an input section with one or more input cells and an output section with one or more output cells. Either the input section or the output section includes at least two cells that may be selected to provide discrete gain settings. A loop amplifier is configured in a feedback arrangement with the input section. The input and output sections may have multiple selectable cells to provide coarse and fine gain steps. The gain of the loop amplifier may be coordinated with the gain of the input section to provide constant bandwidth operation.

13 Claims, 13 Drawing Sheets

INCREMENTAL GAIN AMPLIFIER

CROSS-REFERENCE TO RELATED APPLICATIONS

This application claims priority from U.S. Provisional Patent Application Ser. No. 60/977,225 filed Oct. 3, 2007 titled Variable Gain Amplifier which is incorporated by reference.

BACKGROUND

FIG. 1 illustrates a prior art variable gain amplifier (VGA). The amplifier 10 shown in FIG. 1 includes a first differential pair of transistors Q1,Q2 biased by a first tail current $2I_D$, and a second differential pair of transistors Q3,Q4 biased by a second tail current $2I_N$. The bases of Q1 and Q4 are connected, and the bases of Q2 and Q3 are connected. The collectors of Q1 and Q2 are coupled to the connected bases through a loop amplifier 12, which may be nothing more than a pair of emitter followers.

The operation of this basic translinear VGA was analyzed in an article by Barrie Gilbert, "A New Wide-band Amplifier Technique", *IEEE J. Solid-State Circuits*, vol. SC-3, no. 4, pp. 353-365 (December 1968). Assuming that the transistors are matched, the common base connections between the inner and outer transistors and the common emitter connections within the pairs force the current ratio between Q1 and Q2 to equal the current ratio between Q3 and Q4. A differential current applied to Q1 and Q2 at nodes A and B can be defined in terms of a modulation factor x that varies between $-1$ and $+1$. Thus, the currents through Q1 and Q2 are shown as $(1+x)I_D$ and $(1-x)I_D$, respectively. The modulation factor x is replicated at the second differential pair, and thus, the currents through Q3 and Q4 are shown as $(1-x)I_N$ and $(1+x)I_N$, respectively. When no differential current is applied to Q1 and Q2 (i.e., x=0), a current $I_D$ passes through each of Q1 and Q2, and a current $I_N$ passes through each of Q3 and Q4. When a non-zero differential current is applied to Q1 and Q2 ($x \neq 0$), the currents through Q3 and Q4 are modulated by the same factor x. The current gain of this cell is simply the ratio of the tail currents, i.e., $I_N/I_D$.

The amplifier 10 of FIG. 1 can be configured as an input VGA (IVGA) by providing for control of the input tail current $I_D$. In this configuration it is useful, e.g., for conditioning an input signal with a wide dynamic range (such as a received RF signal) before presenting that signal to circuitry that expects signals in a fairly constant range (e.g., automatic gain control applications). Amplifier 10 can also be configured as an output VGA (OVGA) by providing for control of the output tail current. In this configuration it is useful, e.g., for variable output power/drive applications. Also, since the output current varies linearly with changes in the output tail current, an appropriately designed OVGA can be used as a multiplier. U.S. Pat. Nos. 6,894,564 and 7,190,227, which have a common inventor with this disclosure and are incorporated by reference, disclose some improvements in which the gain of the loop amplifier is coordinated with the gain of the input pair to provide constant bandwidth operation.

FIG. 2 illustrates a prior art variable gain amplifier (VGA) based on a continuously interpolated attenuator. The circuit of FIG. 2 includes an attenuator network 14, a series of transconductance (gm) stages implemented as differential pairs QA1, QB1 . . . QAN,QBN, and a main amplifier 16. The attenuator receives an input signal $V_{IN}$ and generates a series of progressively attenuated signals at output tap points TP1 . . . TPN. Each gm stage is coupled to one of the tap points to receive one of the attenuated signals. The output currents from the gm stages are summed at nodes N1 and N2 and provided to the main amplifier so that the overall output signal is determined by the sum of the output signals from all of the gm stages.

The gm stages are biased by interpolator signals $I_1 \ldots I_N$ from an interpolator (not shown). The interpolator generates the signals $I_1 \ldots I_N$ as a series of continuous, overlapping Gaussian-shaped current pulses having a centroid whose location moves along the series of gm stages as the gain is varied so that most of the interpolator signals are nearly zero, but adjacent stages near the centroid are enabled to some extent.

At the highest gain setting, essentially all of the current from the interpolator is steered to the gm stage closest to the input end of the attenuator (QA1,QB1). Therefore, the first gm stage is active, and the remaining gm stages are effectively off. As the gain is reduced, the interpolator steers the bias current to gm stages further away from the input end of the attenuator, thereby selecting gm stages that receive progressively attenuated versions of the input signal.

As the gain is swept from one extreme to the other, the gm stages are sequentially enabled and disabled in a continuous manner in which one of the interpolation signals gradually increases while the adjacent interpolation signal gradually decreases. Thus, as the gain changes, a centroid or point of action can be envisioned as moving along the series of gm stages to provide continuous interpolation between the tap points. For any given gain setting (in general, other than an extreme minimum or maximum) multiple gm stages are enabled to varying degrees so that the transmission of signals from different attenuator tap points is altered smoothly and continuously. Many improvements to the circuit of FIG. 2 are disclosed in numerous U.S. patents including U.S. Pat. Nos. 6,525,601 and 5,684,431 which have a common inventor with this disclosure.

The VGA illustrated in FIG. 1 is generally configured as an IVGA to cope with varying input signals. A prior art continuously interpolated VGA that is generally configured as an OVGA to provide an output signal of varying amplitude is disclosed in U.S. Patent Application Publication No. 2005/0030121 which has a common inventor with this patent disclosure and is incorporated by reference.

Although the variable-gain amplifiers discussed above provide outstanding performance in many signal processing applications, the presence of analog variable-gain elements in the signal path may introduce noise, nonlinearities, and other problems that limit the performance of the amplifier. For example, in the circuit of FIG. 1, the differential pairs Q1,Q2 and Q3,Q4 operate as analog variable-gain elements and may introduce noise that reduces the dynamic range. They may also introduce nonlinearities that cause distortion.

In the circuit of FIG. 2, the gm stages QA1,QB1 . . . QAN,QBN also operate as analog variable-gain elements, and therefore, may introduce noise and distortion. Moreover, because of their overlapping operation, they may introduce another type of inaccuracy that may be referred to as partition noise, or multiplied noise. That is, in the circuit of FIG. 2, the input signal $V_{IN}$ is attenuated and then partitioned between adjacent gm stages. The amount of signal that is steered by adjacent stages, however, may not be precise because of noise or variations in the interpolator signals and/or gain control signal. The uncertainty or vacillation between the amount of signal steered by adjacent stages may cause low frequency noise to show up in the frequency spectrum of the output signal that does not exist in the input signal. In a VGA having a single analog variable-gain element, the bias noise is common mode and gets cancelled at the output. However, in a VGA having multiple overlapping analog variable-gain elements, this noise is uncorrelated and thus shows up in the output spectrum. Also, since the analog variable-gain elements essentially behave like multipliers, they tend to convert and move noise from point-to-point in the frequency spectrum.

Some of the problems associated with analog variable-gain elements may be overcome by utilizing amplifiers having multiple switched signal paths to provide discrete gain settings in response to a digital word. These amplifiers are known as digitally controlled variable-gain amplifiers (DGAs) and programmable gain amplifiers (PGAs). DGAs and PGAs typically utilize arrays of switches to switch different amounts of attenuation and/or gain into and out of the signal path. To provide small enough gain steps, numerous switches must be controlled by a suitably large digital word. If the word is applied to the amplifier in a parallel format, it increases the number of terminals which drives up the cost of the amplifier. To reduce the required number of terminals, the digital word may be input through a serial interface, but this increases the amount of support logic required to decode the serial data.

DETAILED DESCRIPTION

Incremental Gain Amplifier

Figure 3:
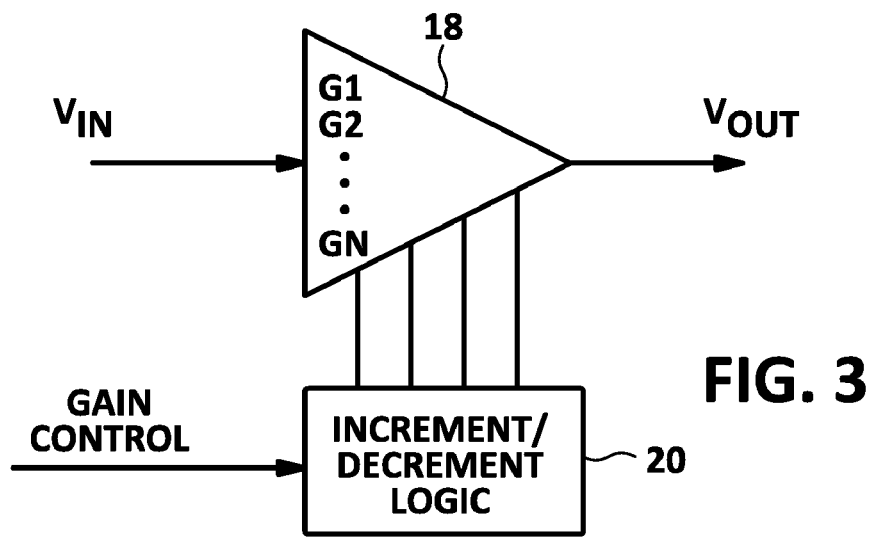
FIG. 3 illustrates an embodiment of an amplifier having incrementally selectable gain steps according to some of the inventive principles of this patent disclosure.

FIG. 3 illustrates an embodiment of a variable-gain amplifier having incrementally selectable gain steps according to some of the inventive principles of this patent disclosure. The circuit of FIG. 3 includes an amplifier section 18 having multiple selectable signal paths to provide discrete gain settings G1, G2 ... GN, and logic 20 to incrementally select the signal paths in response to a gain control interface. Thus, the circuit may be referred to as an incremental gain amplifier (IGA). For example, the amplifier section may include an attenuator with multiple input and/or output taps and an array of switches to selectively switch the taps into and out of the signal path to provide discrete gain settings. In this example, the logic is constructed and arranged to cause the switches to sequentially select the signal paths so that the gain is incremented or decremented periodically as the gain is changed from one setting to another. In some embodiments, the gain is preferably incremented monotonically in uniform steps, but some allowance may be made for non-monotonic and spurious gain changes. Likewise, although the gain steps preferably occur at regular intervals, some allowance may be made for irregular time intervals. In other embodiments, however, non-uniform steps (in terms of gain and/or time) may purposely be implemented to provide various beneficial results. For example, in the embodiment described below with respect to FIG. 12, the system may be altered to provide larger gain steps or more frequent clock pulses to accelerate the loop when error signal has a large magnitude, i.e., the actual gain is far from the setpoint value.

Figure 4:
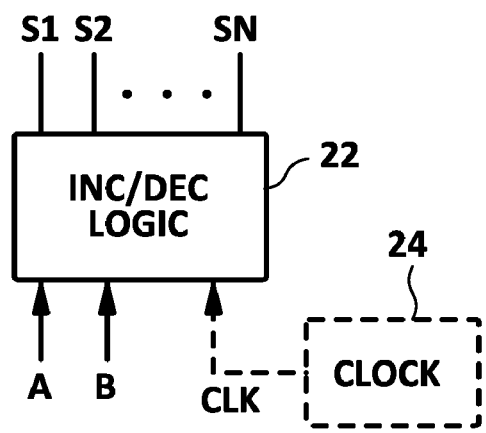
FIG. 4 illustrates an embodiment of logic for controlling an incremental gain amplifier in response to a digital gain control interface according to some inventive principles of this patent disclosure.

FIG. 4 illustrates an embodiment of the gain control logic 22 for driving an incremental gain amplifier in response to a digital gain control interface according to some inventive principles of this patent disclosure. In the embodiment of FIG. 4, the gain control logic generates selection signals S1 ... SN to select the signal paths in an amplifier section in response to digital signals A and B, as well as an optional clock signal CLK. The clock signal, if used, may be provided by an external clock generator 24 or it may be generated internally in the logic. The digital signals A and B may be configured to operate in numerous modes according to some inventive principles of this patent disclosure.

In one mode, the A and B signals function as both direction and clock signals such that an edge of the A signal initiates an asynchronous one-bit increment of a gain counter, and an edge of the B signal decrements the gain counter. The gain counter is decoded to select the appropriate signal paths in the amplifier section. In this mode, a separate clock signal is not necessary, and the time-base for the increment/decrement operation is provided by external circuitry.

In a second mode, the A signal indicates the direction (increment or decrement), while edges in the B signal initiate asynchronous one-bit steps of the gain counter. Alternatively, edges of the CLK signal may be used to step the gain counter.

In a third mode, asserting the A signal causes the gain counter to continuously increment at intervals determined by the CLK signal as long as A is asserted. Asserting the B signal causes the gain counter to continuously decrement at intervals determined by the CLK signal as long as B is asserted.

In a fourth mode, an edge of the A signal causes the gain counter to continuously increment at intervals determined by the CLK signal until an edge of the B signal halts the gain steps. Edges in the reverse order on the A and B signals start and stop a series of continuous decrements of the gain counter.

In a fifth mode, the A and B signals are applied to two inputs of a voltage comparator control the increment/decrement operation. The A and B signals may also be arranged to perform double-duty as logic inputs.

The inventive principles are not limited to these particular modes. Further, in modes or embodiments that utilize a clock signal, there are numerous techniques for implementing the clock according to the inventive principles. In a first configuration, the clock generator may be a free-running device that is included internally in the logic 22 and continuously generates the CLK signal regardless of the state of the A and B signals. This configuration simplifies the gain control interface and reduces the number of terminals required.

In a second configuration, the clock generator is part of the gain control logic, but rather than running continuously, the generator is only activated when gain must be incremented or decremented. For example, in the third mode described above, the CLK signal may only be generated when either of the A or B signals are asserted. In addition to simplifying the gain control interface and reducing the number of terminals, this configuration also reduces the amount of noise introduced by the clock generator because it only runs when necessary to change the gain.

In other configurations, the clock signal may be generated by an external clock generator and applied to the system as a separate dedicated clock signal CLK (as in the second, third and fourth modes described above), or it may be utilized as a time standard for asynchronous increment/decrement pulses (such as the A and B signals in the first mode described above). The use of an external clock generator may reduce the system noise by removing the typically noisy clock generator from the integrated circuit (IC) on which the amplifier is fabricated. Moreover, the use of an external clock enables the user to provide the system with a known frequency standard of an arbitrarily high accuracy in applications where the increment frequency is important.

Alternatively, other embodiments may be constructed so they are capable of operating in any modes and with any clock configuration in response to a use selectable mode and/or configuration inputs.

Figure 5:
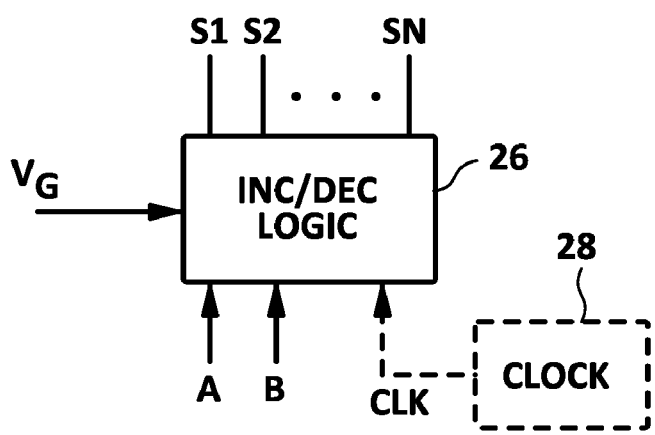
FIG. 5 illustrates an embodiment of logic for controlling an incremental gain amplifier in response to an analog gain control interface according to some inventive principles of this patent disclosure.

In some applications, an analog gain control interface may be needed or preferred, as for example, in automatic gain control (AGC) systems. FIG. 5 illustrates an embodiment of gain control logic for driving an incremental gain amplifier in response to an analog gain control interface according to some inventive principles of this patent disclosure. In the embodiment of FIG. 5, the gain control logic 26 generates selection signals S1 . . . SN to select the signal paths in an amplifier section in response to an analog gain control signal $V_G$ and an optional clock signal CLK. The clock signal, if needed, may be provided by an external clock generator 28 or it may be generated internally in the logic. The logic is constructed and arranged so that, as the gain control signal $V_G$ increases from a minimum to a maximum, the selection signals S1 . . . SN sequentially select discrete signal paths in an amplifier so that the gain is incremented periodically until the maximum gain is reached. Although the gain is preferably incremented monotonically, some allowance may be made for non-monotonic and spurious gain changes. In some embodiments, the gain steps occur at regular intervals, while in others, the intervals may vary depending on factors such as the rate at which $V_G$ changes, the frequency of the clock signal CLK (if used), etc.

Figure 6:
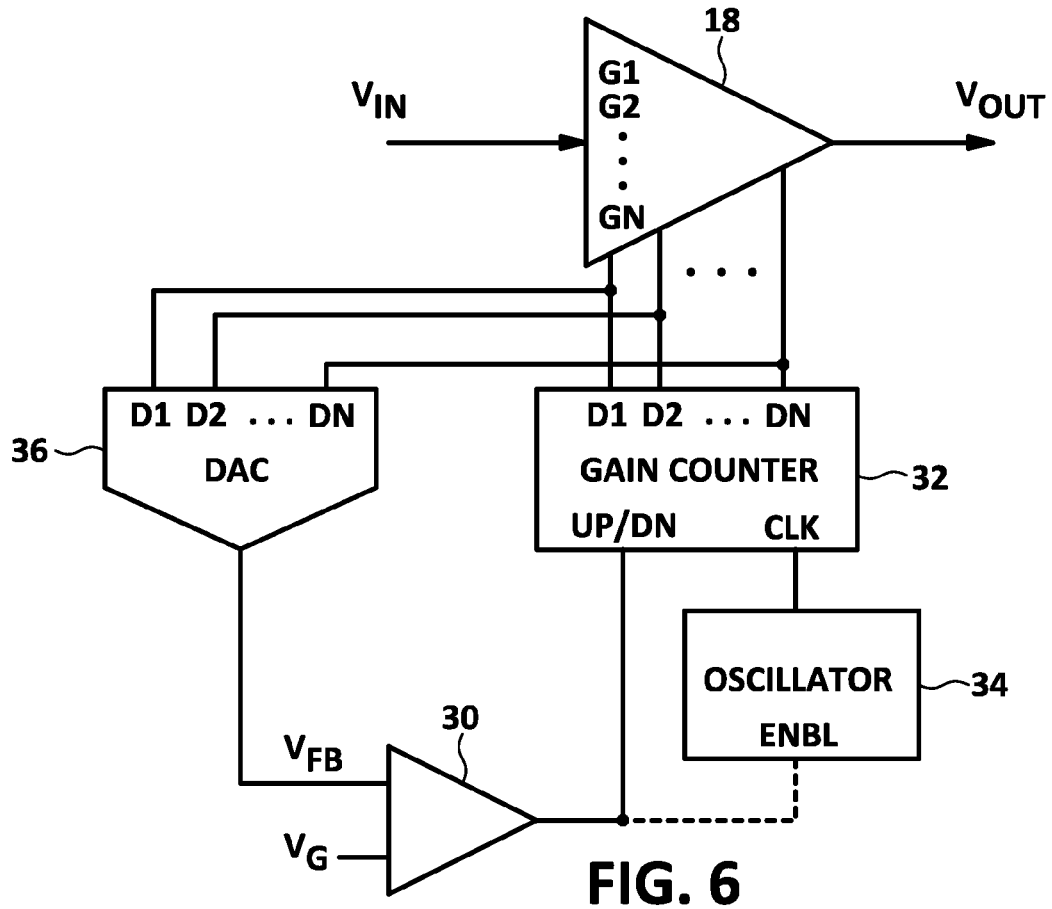
FIG. 6 illustrates an embodiment of gain control logic according to some inventive principles of this patent disclosure.

FIG. 6 illustrates an example of a technique for implementing the analog-input gain control logic of FIG. 5 according to some inventive principles of this patent disclosure. Referring to FIG. 6, the gain control signal $V_G$ is applied as an analog signal to one input of a comparator 30. The output of the comparator drives the up/down input of a gain counter 32 which generates digital outputs D1 . . . DN to select the discrete gain settings G1, G2 . . . GN of amplifier section 18. The digital outputs are also applied to a digital-to-analog converter (DAC) 36 where they are converted to an analog feedback signal $V_{FB}$ that drives another input of the comparator. An oscillator 34 provides the clock signal CLK to set the increment/decrement interval for the gain counter. The comparator may be implemented as a window comparator to provide a deadband around $V_G$ in which the gain counter is neither incremented nor decremented, and the comparator output may optionally be used to disable the oscillator when the feedback signal is within the deadband.

Depending on the implementation details, the digital outputs may be applied directly to the amplifier section, or they may be decoded as selection signals. For example, if the amplifier section is implemented with binary-weighted gain paths, the digital outputs D1 . . . DN may be applied directly to the amplifier section to provide the selected gain by enabling multiple parallel gain paths. If, however, the amplifier section is implemented with an attenuator designed for operation with a single tap point, the digital outputs may need to be decoded to generate individual selection signals that correspond to each tap point.

Figure 2:
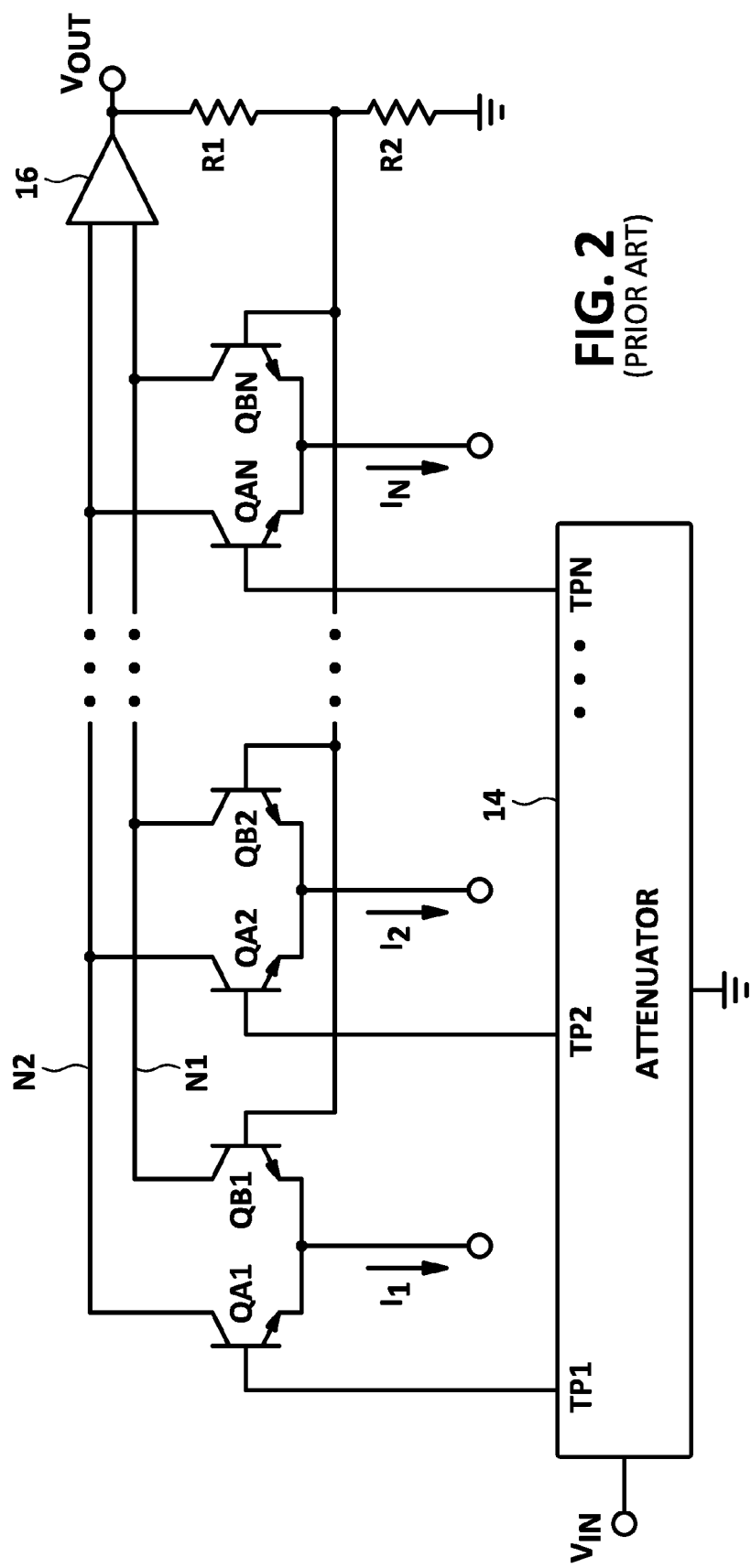
FIG. 2 illustrates a prior art variable gain amplifier based on a continuously interpolated attenuator.

The inventive principles illustrated in the embodiments of FIGS. 3-6 are not limited to any particular type of amplifier section having multiple selectable signal paths. For example, the inventive principles may be applied to the prior art circuit of FIG. 2 to transform it from a continuously variable amplifier to an amplifier having discrete gain settings. That is, rather than driving the gm stages QA1,QB1 . . . QAN,QBN with overlapping current pulses from an interpolator, they may be fully switched in a sequential manner by selection signals S1 . . . SN to select the signal paths and provide discrete gain settings. In some embodiments, only one gm stage may be on at a time. In other embodiments, multiple stages may be fully enabled depending on the type and resolution of gain settings. As a further example, the amplifier section may be implemented with separate input and output sections and a loop amplifier, wherein the input and/or output sections include multiple cells to provide discrete gain settings as described below.

Figure 7:
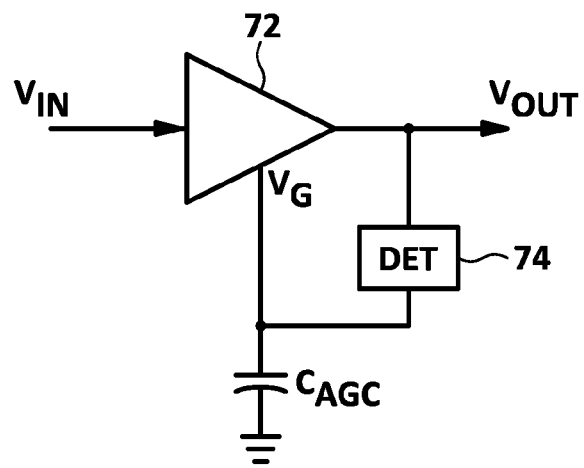
FIG. 7 illustrates the structure of an embodiment of an automatic gain control system according to some of the inventive principles of this patent disclosure.

FIG. 7 illustrates the structure and operation of an embodiment of an automatic gain control (AGC) system according to some of the inventive principles of this patent disclosure. The system of FIG. 7 includes an incremental gain amplifier 72 including an amplifier section having selectable signal paths to provide discrete gain settings, and logic to incrementally select the signal paths in response to an analog gain control signal $V_G$. An integrator $C_{AGC}$ generates the analog gain control signal in response to an output signal from a detector cell 74, e.g., a squaring cell, which is coupled to the output of the amplifier. As discussed above, the period $T_{CLK}$ of the gain clock in the amplifier may need to be much smaller than the time constant of the AGC system $\tau_{AGC}$ to prevent the internal feedback loop in the amplifier from interfering with the dynamics of the AGC loop.

Figure 8:
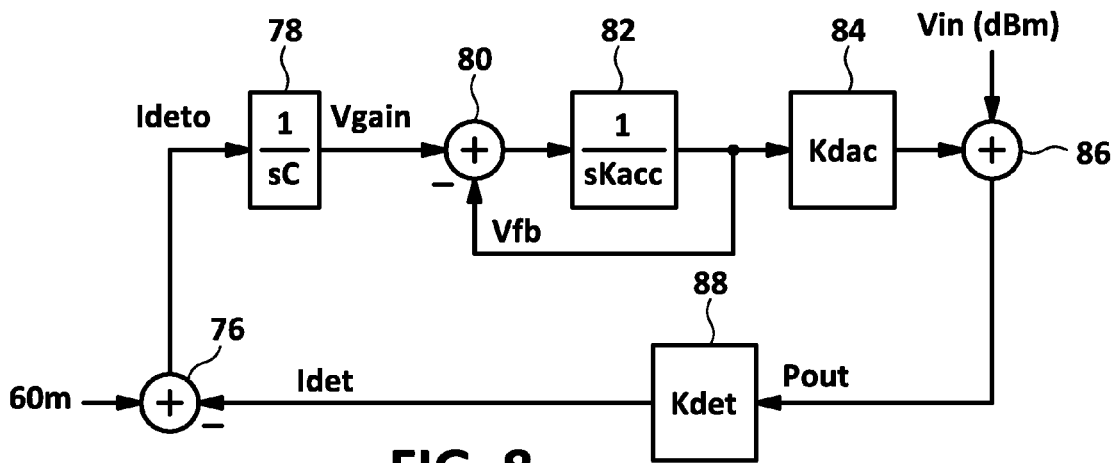
FIG. 8 illustrates the operation of an embodiment of an automatic gain control system according to some of the inventive principles of this patent disclosure.

FIG. 8 illustrates a construct for modeling the operation of an embodiment of an automatic gain control (AGC) system according to some of the inventive principles of this patent disclosure. For example, the construct of FIG. 8 may be used to model the system of FIG. 7 where Ideto represents a final output current from detector 74, the 1/sC element 78 represents the integration capacitor $C_{AGC}$, the 1/sKacc element 82 represents a gain counter (accumulator) in the incremental gain amplifier, the Kdac element 84 represents a DAC in the incremental gain amplifier, and the Kdet element 88 represents the detector 74. The detector output Idet is subtracted from a reference (shown here arbitrarily as 60 mA) by summing circuit 76 to generate the final detector output Ideto.

The 1/sKacc element 82 may linear or non-linear depending on the implementation of the gain counter and the clock source. For example, in some embodiments the clock may be implemented as a simple fixed-frequency signal that always increments the gain counter at the same frequency. In other embodiments, however, the clock may be implemented so that its frequency depends on how far the feedback signal is from the gain control signal. For example, the embodiment of FIG. 12 may be modified to include logic to increase the frequency of the clock signal CLK as the magnitude of $V_{ERR}$ increases. Thus, if $V_{FB}$ far from $V_G$, the clock speeds up to drive $V_{FB}$ more rapidly toward $V_G$, but then slows down as the actual gain closes in on the desired setting.

Selectable Gain Amplifier with Multiple Input/Output Cells

Figure 9:
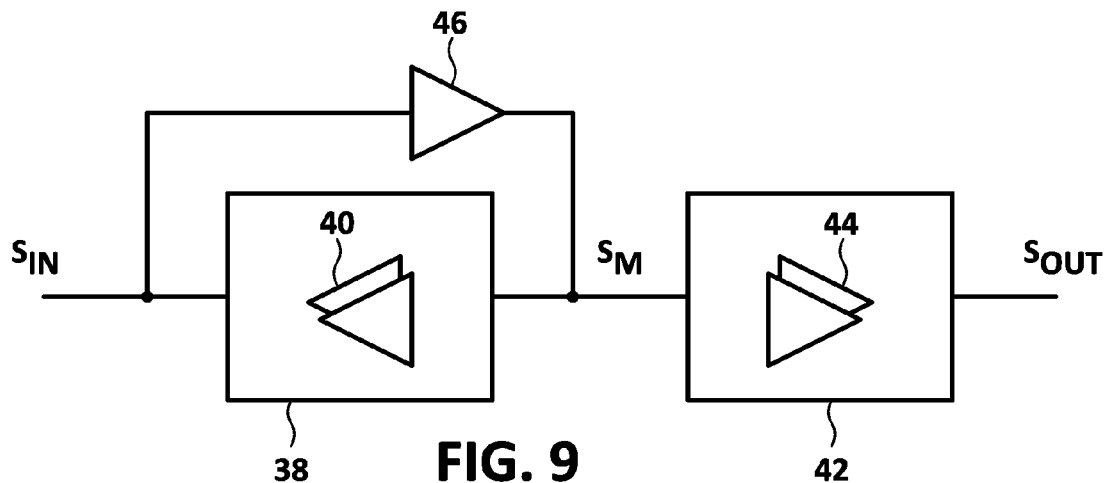
FIG. 9 illustrates an embodiment of an amplifier having selectable signal paths to provide discrete gain settings according to some of the inventive principles of this patent disclosure.

FIG. 9 illustrates an embodiment of an amplifier having selectable signal paths to provide discrete gain settings according to some of the inventive principles of this patent disclosure. The circuit of FIG. 9 includes an input section 38 having at least one input cell 40, and a loop amplifier 46 configured in a feedback arrangement with the input section to generate an intermediate signal $S_M$ in response to an input signal $S_{IN}$ applied to the input section. An output section 42 has at least one output cell 44 to generate an output signal $S_{OUT}$ in response to the intermediate signal. The input section and/or the output section includes at least one additional cell that may be selected to change the gain of the amplifier.

The embodiment of FIG. 9 may be implemented in a multitude of different configurations. For example, the input and output sections may include any number of selectable cells that provide gain steps of any magnitude to provide an arbitrarily wide gain range and/or arbitrarily fine gain steps. The gain of the loop amplifier may optionally, though not necessarily, be coordinated with the overall gain of the input section, e.g., to provide constant bandwidth operation. Moreover, the inventive principles illustrated in the embodiment of FIG. 9 are not limited to any particular type of selectable cells, and the loop amplifier, which may have fixed or variable gain of any suitable value, is not limited to any particular type of amplifier.

Figure 10:
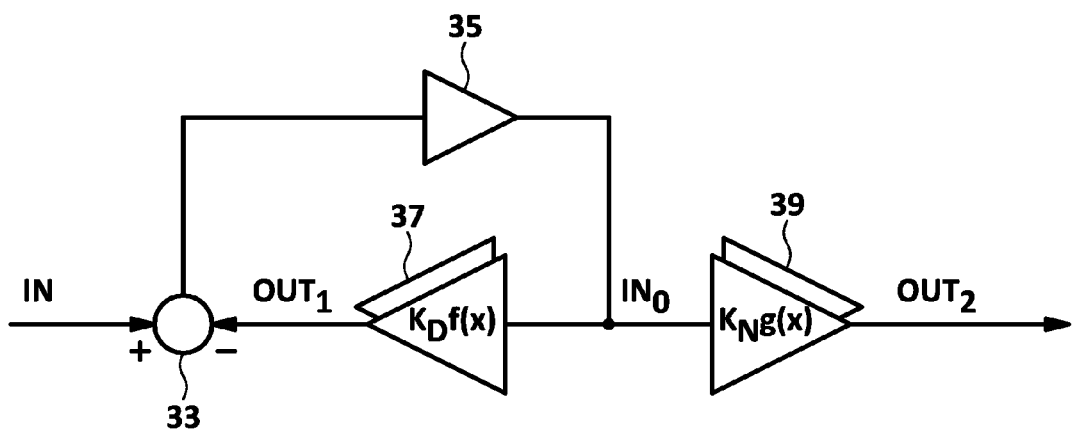
FIG. 10 illustrates another embodiment of an amplifier having selectable signal paths to provide discrete gain settings according to some of the inventive principles of this patent disclosure.

FIG. 10 illustrates another embodiment of an amplifier having selectable signal paths to provide discrete gain settings according to some of the inventive principles of this patent disclosure. In the embodiment of FIG. 10, the input section includes one or more input cells 37 that implement a generic function f(x) with a scaling factor $K_D$. The output section includes one or more output cells 39 that implement a generic function g(x) with a scaling factor $K_N$. The output and/or input section includes at least two cells that that may be selected to change the gain of the amplifier. A loop amplifier 35 is arranged to generate an intermediate signal $IN_0$ that drives the input cells in such a manner as to force the magnitude of the input signal IN to equal the magnitude of $OUT_1$ at a nulling point 33. The signals may be analyzed as follows:

$$OUT_1 = K_D f(IN_0) \quad \text{(Eq. 1)}$$

$$OUT_2 = K_N g(IN_0) \quad \text{(Eq. 2)}$$

If f(x) and g(x) are the same function, then MN( )=g($IN_0$), and since the servo loop forces IN=$OUT_1$, then the overall gain is as follows:

$$OUT_2 = \frac{K_N}{K_D} IN \quad \text{(Eq.3)}$$

Thus, the overall gain is merely the ratio of $K_N$ and $K_D$ which depend on the number of cells selected in the input section and/or the output section, respectively. The functions f(x) and g(x) need not be linear. Moreover, they need not be the same function, although Eq. 3 will be altered if f(x) and g(x) are different functions.

Figure 11:
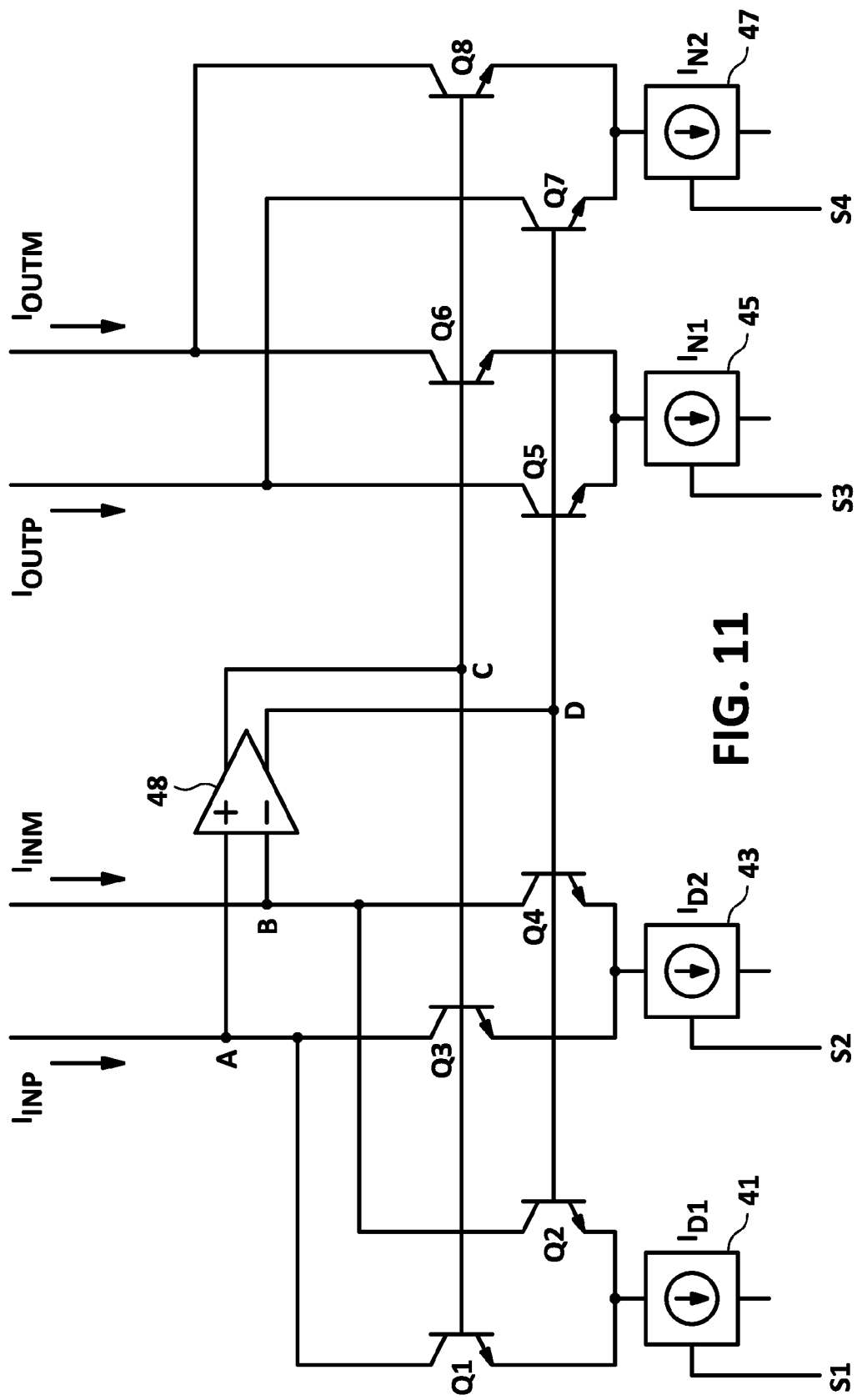
FIG. 11 illustrates an embodiment of an amplifier having selectable transistor pairs according to some of the inventive principles of this patent disclosure.

FIG. 11 illustrates an example embodiment in which the input cells are implemented as transconductance (gm) cells although, as discussed below, they may alternatively be characterized as transresistance (rm) cells. Specifically in this case, differential transistor pairs Q1,Q2 and Q3,Q4 arranged to convert an input current to an output voltage. The first pair Q1,Q2 is biased by a tail current $I_{D1}$ provided by switchable current source 41 in response to a selection signal S1, while the second pair Q3,Q4 is biased by a tail current $I_{D2}$ provided by switchable current source 43 in response to another selection signal S2. In this embodiment, the output cells are implemented as gm cells, more specifically in this case, differential transistor pairs arranged to convert an input voltage to an output current. The two differential pairs Q5,Q6 and Q7,Q8 are biased by switchable currents $I_{N1}$ and $I_{N2}$ in response to selection signals S3 and S4, respectively. The bases of the outer transistors of each pair are connected together at node C, while the bases of the inner transistors of each pair are connected together at node D. Loop amplifier 48 is arranged to drive intermediate nodes C and D in response to the input nodes A and B.

An input signal is applied in the form of a differential current $I_{INP}, I_{INM}$ which creates a $\Delta V_{BE}$ at the bases of any differential pairs that may be enabled in the input section. This $\Delta V_{BE}$ is conveyed through nodes C and D to the bases of any output differential pairs that may be enabled. The collector currents of the selected output pairs are summed to generate the output differential current $I_{OUTP}, I_{OUTM}$. The loop amplifier linearizes the input by dividing down the $\Delta V_{BE}$, which is a nonlinear function, appearing at nodes C and D. The nonlinearity at the input is related to $\Delta V_{BE}$ divided by the gain of the loop amplifier. Thus, by using a loop amplifier with a relatively high gain, the nonlinearity at nodes C and D can be transformed to a much smaller nonlinearity at the input nodes A and B, thereby reducing distortion.

The input differential pairs Q1,Q2 and Q3,Q4 may be characterized differently depending on the perspective. From the point of view of nodes A and B, they convert an input current to an output voltage and may thus be characterized as transresistance cells. From the point of view of nodes C and D, however, they are driven at their bases by the output voltage from the loop amplifier to generate a current that works into the source impedance at the input nodes and thus, they may be characterized as transconductance cells.

The current gain of the embodiment of FIG. 11 is related to the ratio of the tail currents of the input section and the tail currents of the output section. Assuming all of the transistors are matched, the gain is $I_2/I_1$ where $I_1$ is the sum of the tail currents of the selected transistor pairs in the input section, and $I_2$ is the sum of the tail currents of the selected pairs in the output section.

The input and output cells in the embodiment of FIG. 11 are shown as simple differential pairs of transistors, but multi-tan h cells or other types of transconductance cells may also be used. Moreover, when using multi-tan h cells, gain steps may implemented not only by switching in different numbers of cells having the same multi-tan h configuration, but also by switching in multi-tan h cells having different configurations in terms of the number of transistors in each cell (e.g., doublet, triplet, etc.), parallel versus serial cell arrangements, different emitter area ratios, etc.

The embodiment of FIG. 11 is shown generically with each differential pair being enabled in response to an independent selection signal because the fundamental inventive principles relating to the amplifier embodiments of FIGS. 9, 10 and 11 are not limited to any particular system for driving the selection signals. However, some additional inventive principles provide numerous systems for coordinating the selection signals. For example, in one embodiment, the selection signals may be driven so that only one differential pair may be enabled at a time in the input section. In another embodiment, multiple pairs may be enabled simultaneously. In other embodiments, one or more pairs may always be enabled while other pairs are selectively enabled. Similar systems may be used to enable the differential pairs in the output section, and various combinations of these systems may be utilized simultaneously with the input and output sections.

The embodiment of FIG. 11 is shown with two selectable cells in each of the input and output sections, but any number of cells may be used in either section, as long as one of the sections has at least two cells configured to provide at least two different discrete gain settings. For example, the circuit may be arranged as an IVGA by implementing coarse gain steps with the input section and fine gain steps with the output section. Conversely, the circuit may be arranged as an OVGA by implementing coarse gain steps with the output section and fine gain steps with the input section. As yet another example, an implementation having enough resolution in both the input and output sections maybe flexibly configured for IVGA or OVGA operation by the user.

By eliminating analog variable gain elements, the circuit of FIG. 11 may reduce the various types of noise and distortion associated with continuous VGAs. Moreover, because the differential pairs in the circuit of FIG. 11 operate at fixed tail currents when selected, it enables the use of emitter degeneration which may dramatically improve linearity as described in more detail below.

The inventive principles relating to selectable gain amplifiers are not limited to any particular embodiments or applications. However, they are especially beneficial when combined with the inventive principles relating to incremental gain amplifiers as described above.

Figure 12:
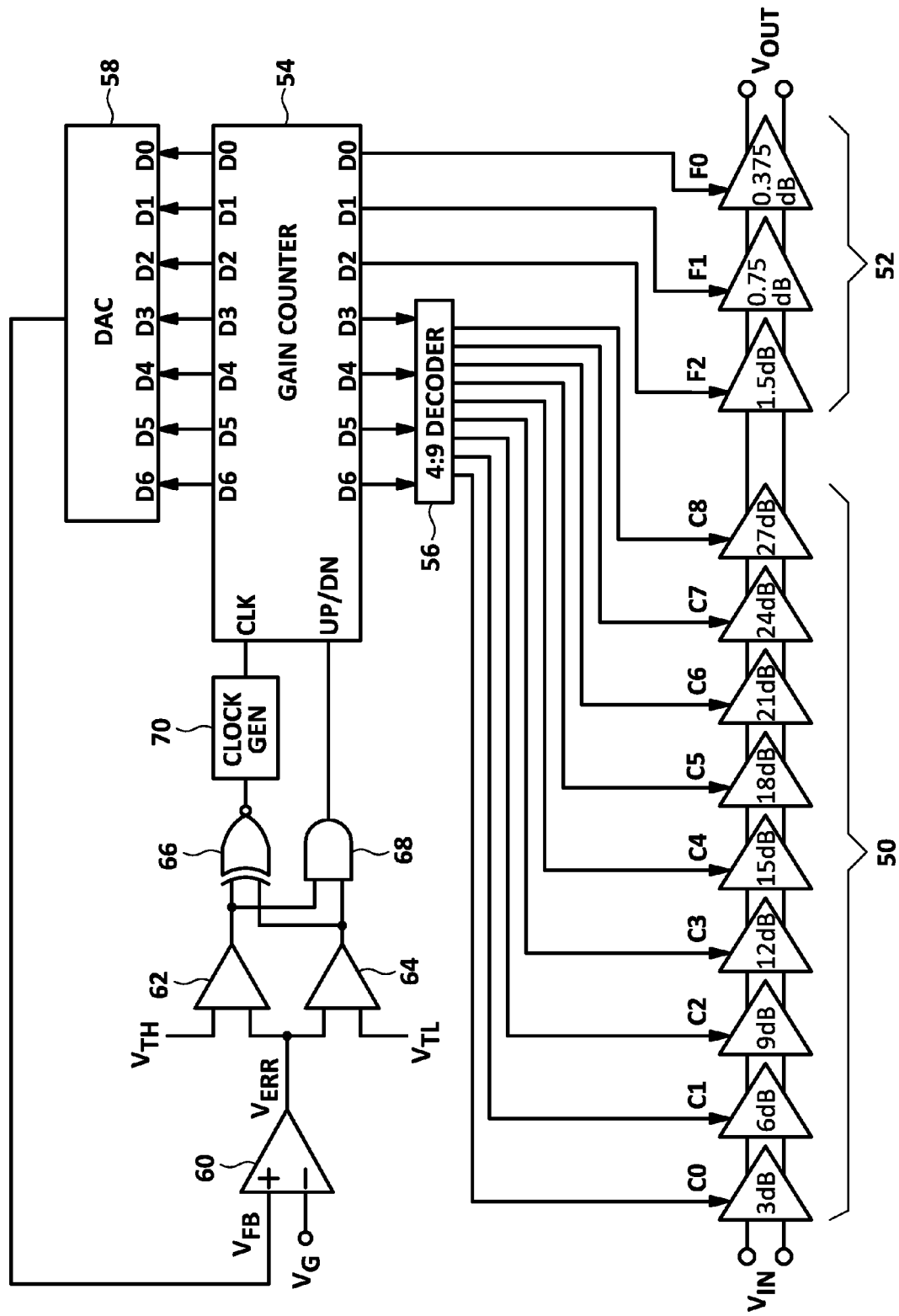
FIG. 12 illustrates an embodiment of an incremental gain amplifier having multiple input/output gains cells to provide discrete gain settings according to some inventive principles of this patent disclosure.

FIG. 12 is a block diagram of an embodiment of an incremental gain amplifier having multiple input/output gains cells to provide discrete gain settings according to some additional inventive principles of this patent disclosure. The embodiment of FIG. 12 includes twelve selectable gain cells. The first nine cells are part of the input section 50 and are arranged so that only one cell is enabled at a time to provide coarse gain settings from 3 dB to 27 dB in 3 dB steps.

The last three cells are part of the output section 52 and are binary weighted (i.e., 1.5 dB, 0.75 dB and 0.375 dB) and arranged so that more than one cell may be enabled simultaneously to provide fine gain adjustment in 0.375 dB steps between the 3 dB steps of the coarse cells.

The overall amplifier gain is set by a 7-bit gain counter 54 which may be incremented or decremented by one within a range of n=0 to 71 to provide 72 discrete gain settings. The three least significant bits D0-D2 from the gain counter are used directly as the selection signals F0-F2 for the fine gain cells. The four most significant bits D3-D6 from the gain counter are applied to a 4:9 decoder 56 to generate the selection signals C0-C8 for the coarse gain cells.

The outputs D0-D7 from the gain counter are also applied to a DAC 58 which converts the digital gain word into an analog feedback voltage $V_{FB}$. An error amplifier 60 amplifies the difference between $V_{FB}$ and an analog gain control signal $V_G$ to generate an error signal $V_{ERR}$. Comparators 62 and 64 form a window comparator to compare $V_{ERR}$ within a window bounded by a high threshold voltage $V_{TH}$ and a low threshold voltage V. The comparator outputs are combined by AND gate 68 to generate the signal UP/DN which controls the direction in which the counter is incremented. The comparator outputs are also combined by an exclusive nor (XNOR) gate 66 which enables a clock generator 70 when the error signal deviates from the comparator threshold window.

In operation, the DAC and window comparator operate as a feedback loop that servos the system by incrementing the gain counter in the up or down direction (i.e., incrementing or decrementing the counter) until the feedback signal $V_{FB}$ is within a predetermined threshold level of the gain setting specified by $V_G$, and the appropriate input and output cells are selected. The clock generator is disabled and the gain counter is not clocked when the gain error is settled into the deadband between high and low comparator thresholds.

The system of FIG. 12 may be embodied as a complete, robust, and inexpensive solution where a variable gain amplifier having reduced noise is required. The selectable signal paths provide discrete gain settings that reduce the various types of noise and distortion associated with analog variable gain elements. Moreover, despite the sophistication of the incremental gain control circuitry, the gain may be controlled by a single analog gain control signal $V_G$. This reduces the pin count and cost of an integrated circuit (IC) embodiment of the system.

In some practical implementations, the frequency of the clock signal CLK (the "gain clock") may be important for proper system operation. For example, if an incremental gain amplifier according to the inventive principles of this patent disclosure is used in an AGC system as described below with reference to FIG. 7, the frequency of the gain clock may need to be high enough so that internal feedback loop of the amplifier runs much faster than AGC loop. Thus, the period of the gain clock may need to be much smaller than the time constant of the AGC system (i.e., $T_{CLK} \ll \tau_{AGC}$) to prevent the internal feedback loop from interfering with the dynamics of the AGC loop.

Another concern in practical implementations is the monotonicity of the gain counter. As the counter is incremented through certain output codes, some transitions may cause glitches that temporarily select the wrong cells. Thus, the counter may require appropriate de-glitching circuitry to prevent spurious gain changes in applications that are sensitive to such glitches.

As discussed above, the principles related to selectable gain amps having multiple input/output cells are independent of those relating to incremental gain amplifiers. Thus, in other embodiments, the gain counter and other incremental gain apparatus of FIG. 12 may be eliminated, and the gain may be selected by applying a digital gain control word directly to the system as D0-D7.

Figure 13A:
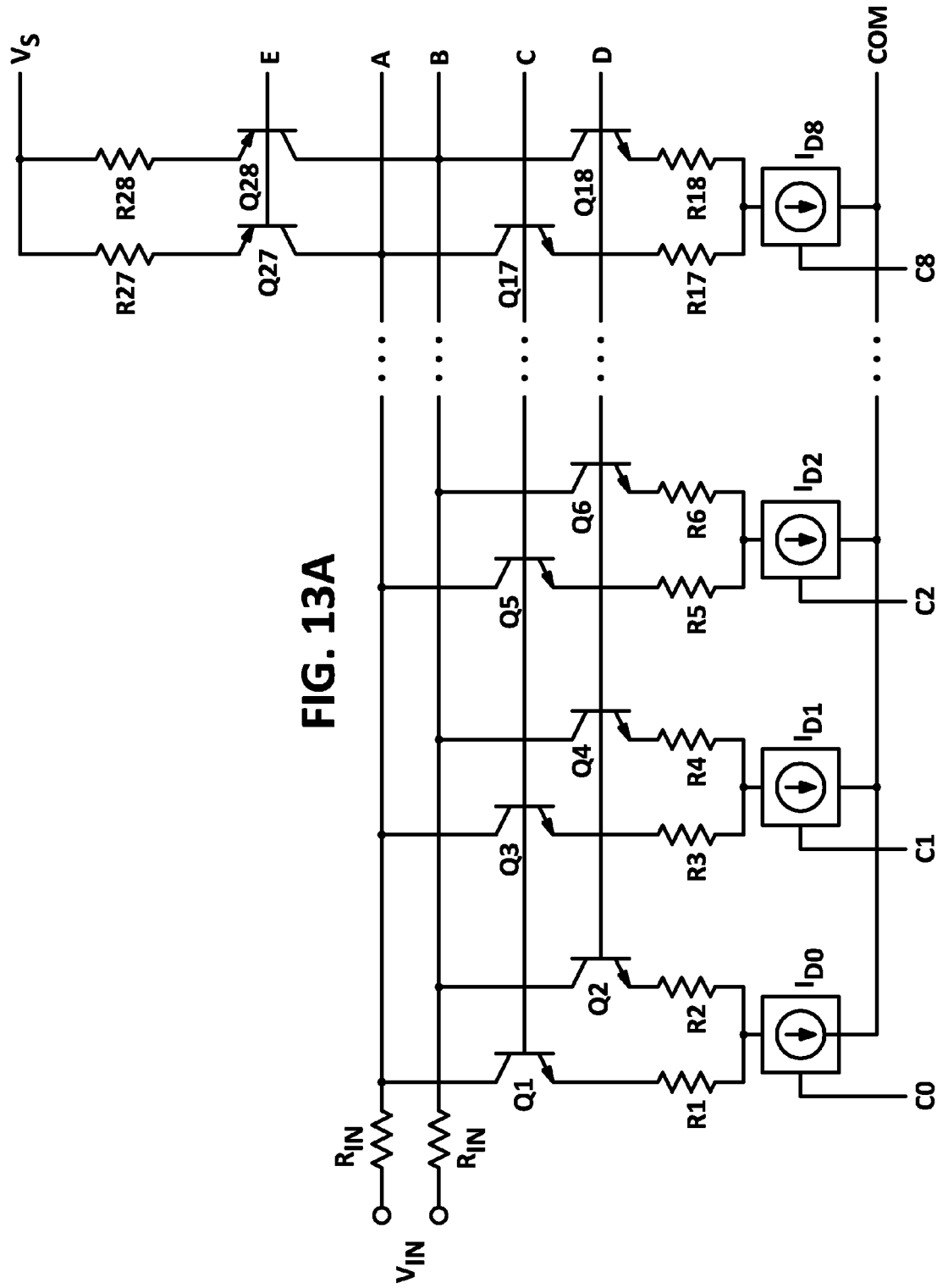
FIGS. 13A and 13B illustrate an embodiment of an amplifier having input and output cells and a loop amplifier with discrete gain steps and coordinated gain control according to some of the inventive principles of this patent disclosure.
Figure 13B:
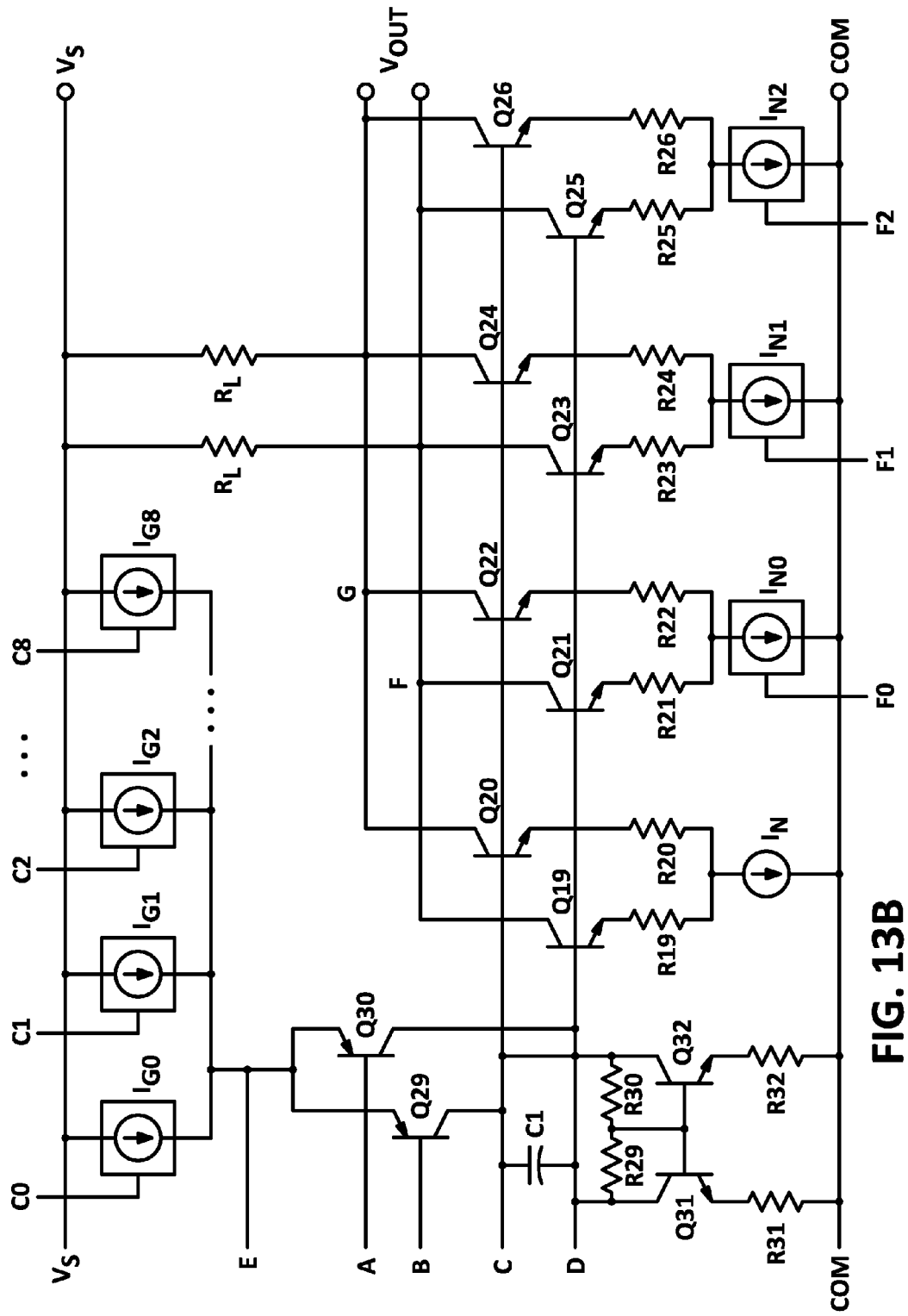

FIGS. 13A and 13B (collectively, "FIG. 13") illustrate a more detailed embodiment of the input and output cells or stages shown in FIG. 12, along with a loop amplifier having coordinated gain control according to some of the inventive principles of this patent disclosure. In the embodiment of FIG. 13, the input section includes differential pairs Q1,Q2 through Q17,Q18 arranged to be enabled by switchable tail currents $I_{D0}$ through $I_{D8}$ in response to selection signals C0 through C8. The collectors of the input differential pairs are connected at nodes A and B which receive load currents from the current sources formed by transistors Q27 and Q28 along with degeneration resistors R27 and R28 which help reduce noise. Nodes A and B also receive the differential input signal $V_{IN}$ through matched resistors $R_{IN}$.

The output section includes differential pairs Q21,Q22 through Q25,Q26 arranged to be enabled by switchable tail currents $I_{N0}$ through $I_{N2}$ in response to selection signals F0 through F2. An additional differential pair Q19,Q20 is always on and biased by a tail current $I_N$ to define the minimum gain. The collectors of the output differential pairs are connected at output nodes F and G which are loaded by resistors $R_L$ connected to a power supply $V_S$. The output signal is taken as the differential voltage $V_{OUT}$ at nodes F and G. A power supply common terminal COM provides a return path for the power supply.

The loop amplifier includes a differential pair of transistors Q29,Q30 which are biased by a gain control circuit including switchable tail currents $I_{G0}$ through $I_{G8}$ in response to the same selection signals C0 through C8 that control the input section. Thus, the gain of the loop amplifier may be coordinated with the gain of the input section, e.g., to provide constant loop gain. Transistors Q29 and Q30 drive nodes C and D in response to the signal at nodes A and B.

Transistors Q31 and Q32 and resistors R29 through R32 are arranged to set the common mode voltage at nodes C and D. Resistors R29 and R30 sample the midpoint voltage between nodes C and D, and transistors Q31 and Q32 drive common mode voltage at nodes C and D to a value that is one $V_{BE}$ plus the voltage dropped across resistors R31 and R32.

A capacitor C1, which sets the dynamics of the loop, is connected across nodes C and D. Additional matched transistors may be cross-connected with Q29 and Q30, as well as the input differential pairs to cancel the effects of collector-junction capacitance ($C_{JC}$).

As the differential pairs in the input section are selectively enabled and disabled, the total current $I_t$, which is the sum of the tail currents of the selected transistor pairs in the input section, also varies. Transistors Q27 and Q28 are arranged to absorb these varying amounts of current.

In this embodiment, the bases of transistors Q27 and Q28 are connected to the common emitter node E of Q29 and Q30 to provide a bias voltage to the bases of Q27 and Q28, but other arrangements may be employed as described below.

As in the embodiment of FIG. 12, the input differential pairs may be configured to provide 3 dB coarse gain steps, while the output differential pairs are configured to provide ⅜ dB fine gain steps. Alternatively, the circuit may be configured with any other suitable number of cells and gain steps in the input and output sections.

As mentioned above, an advantage of a selectable gain amplifier having multiple input and/or output cells is that it enables the use of emitter degeneration with the input and output cells. Such an arrangement would not be possible with the prior art circuit of FIG. 1 because the degeneration voltage would change as the gain control currents $I_D$ and $I_N$ are changed to vary the gain. The circuit relies on the accurate conveyance of the $\Delta V_{BE}$ from the input pair to the output pair at nodes C and D. Thus, in the prior art circuit of FIG. 1, emitter degeneration would undermine the fundamental principles of operation. However, in the circuit of FIG. 13 (and the circuit of FIG. 11), degeneration resistors (if included) may be sized in conjunction with the various tail currents to provide a constant degeneration voltage which is simply added to the $\Delta V_{BE}$ appearing across nodes C and D.

Figure 1:
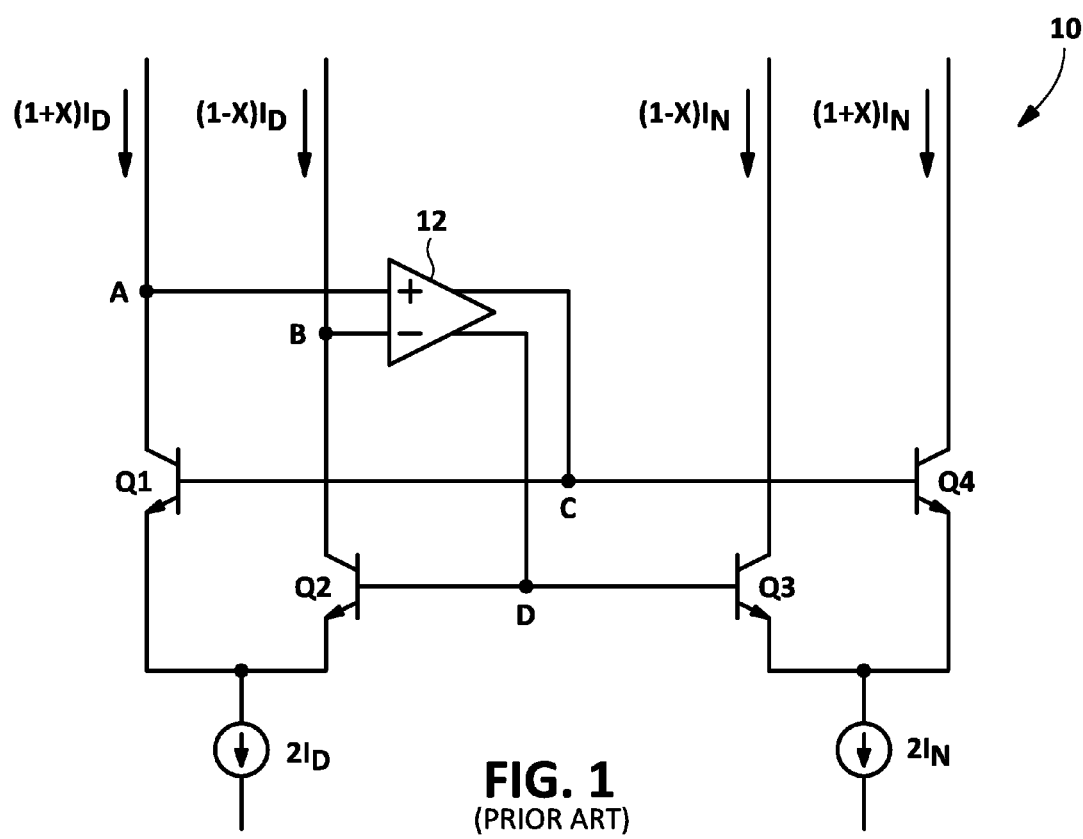
FIG. 1 illustrates a prior art translinear variable gain amplifier.

To understand the effect of emitter degeneration in a multiple input cell architecture according to the inventive principles of this patent disclosure, consider first the conventional circuit of FIG. 1. The differential voltage $V_i$ at nodes C and D, which is sometimes referred to as the "characteristic" (or "incidental") voltage, can be expressed as follows:

$$V_1 = V_T \tanh\left(\frac{1+X}{1-X}\right) \qquad \text{(Eq.4)}$$

where $V_T$ is the thermal voltage, and X is a modulation index that varies between −1 and +1 as the input is swept through its entire range. The voltage $V_1$ is nonlinear, and it shows up at the input (which behaves as a virtual ground) divided by the gain $A_o$ of the servo amplifier. Thus, one source of nonlinearity in the circuit of FIG. 1 is the voltage $V_i/A_0$ caused by the nonlinear characteristic voltage at nodes C and D being reflected back to the input. Although increasing $A_o$ may reduce the nonlinearities at the input, there is a limit to the loop gain, beyond which, the system becomes unstable.

Turning to the circuit of FIG. 13, emitter degeneration can now be utilized in the input cells because the degeneration resistors may be sized in conjunction with the various tail currents to provide a constant degeneration voltage regardless of the gain setting. Since emitter degeneration reduces the gain attributed to the input cells, it enables the gain $A_o$ of the servo amplifier to be increased, thereby improving the linearity at the input, while still maintaining the stability of the loop. That is, for any overall gain setting, the value of $A_o$ can be increased, and thus, the nonlinear voltage $\Delta V_{ID}/A_o$ reflected back to the input can be reduced.

Moreover, the addition of the emitter degeneration voltage to the characteristic voltage at nodes C and D does not adversely affect the linearity. The differential voltage $V_{CD}$ at nodes C and D in FIG. 13 can be expressed as follows:

$$V_{CD} = V_1 + V_{DGN} \qquad \text{(Eq. 5)}$$

where $V_1$ is the nonlinear characteristic voltage as in Eq. 4, and $V_{DGN}$ is the degeneration voltage created by the tail currents $I_{D0} \ldots I_{D8}$ flowing through degeneration resistors R1 ... R18. The total characteristic voltage reflected back to the input is now $(V_{CD}+V_{DGN})/A_0$. Since $V_{DGN}$ is linear, the nonlinear portion is the same as in the circuit of FIG. 1, but now it can be divided down by a higher value of $A_0$, and as a result, the linearity at the input may be improved.

In comparison, reducing the gain of the input transistor pair in the circuit of FIG. 1 by reducing the tail current would also reduce the input signal range. In the circuit of FIG. 13, however, the use of emitter degeneration enables the tail current to be increased, thereby increasing the input range of an input cell without increasing the gain attributed to the input cell.

Further, not only do the degeneration resistors reduce distortion and extend the linear operation range, but they may also make the circuit less sensitive to mismatches because resistors can generally be matched more accurately than transistors on an integrated circuit.

Figure 14:
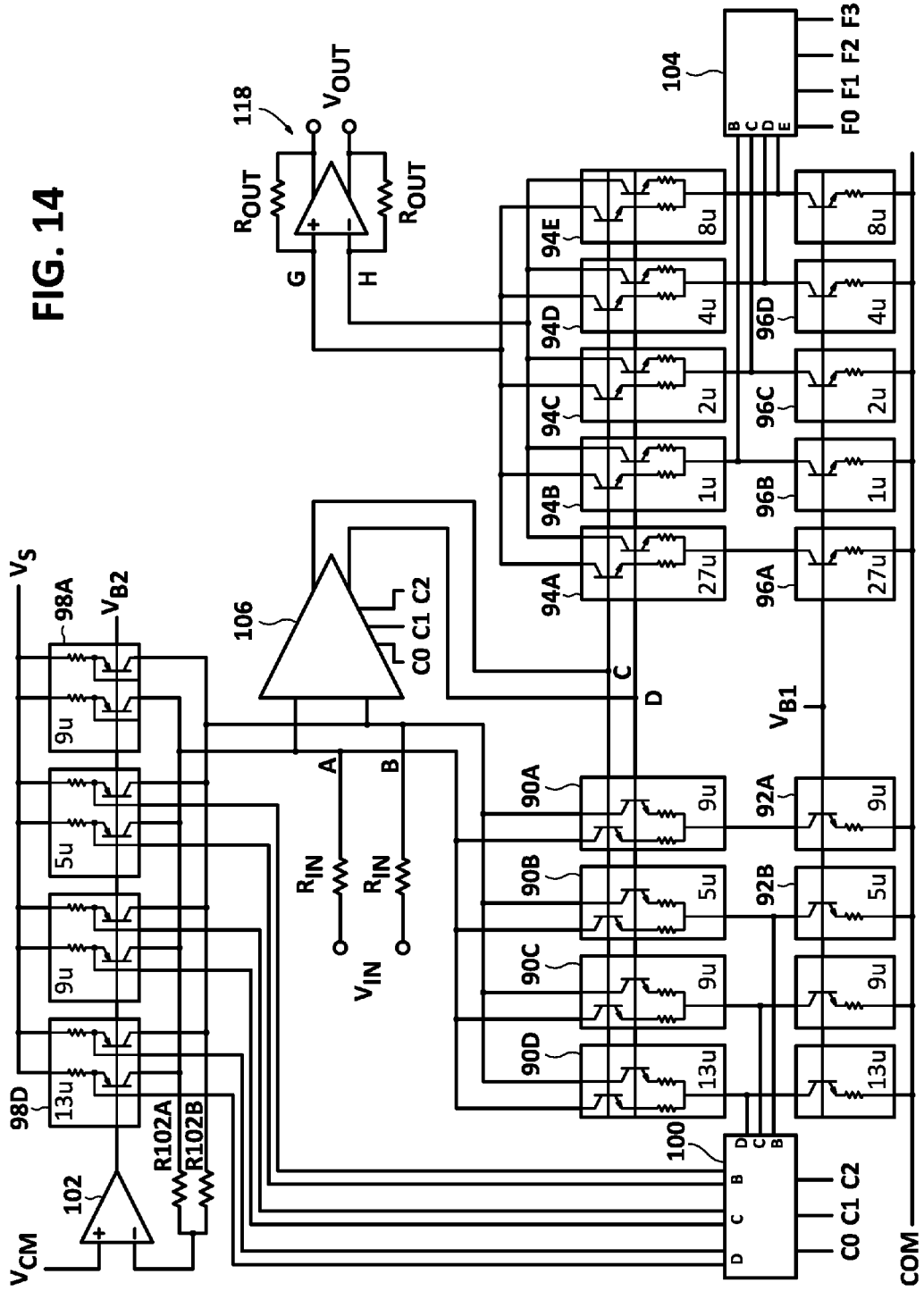
FIG. 14 illustrates another embodiment of an amplifier having input and output cells and a loop amplifier with discrete gain steps and coordinated gain control according to some of the inventive principles of this patent disclosure.

FIG. 14 illustrates another embodiment of an amplifier having selectable signal paths to provide discrete gain settings according to some of the inventive principles of this patent disclosure. The embodiment of FIG. 14 includes an input section having input cells 90A-90D that are biased by current sources 92A-92D and selectively enabled and disabled in response to coarse gain control signals C0-C2. An output section includes output cells 94A-94E that are biased by current sources 96A-96E and selectively enabled and disabled in response to fine gain control signals F0-F3. The accuracy of the incidental voltage at nodes C and D depends in part on the matching between the input and output sections. To maintain good matching as different numbers of input and output cells are selectively switched in and out, the individual input and output cells and current sources are implemented as parallel unit cells where the number preceding the letter "u" specifies the number of parallel unit cells. For example, input cell 90B is shown schematically as a single pair of emitter degenerated transistors. However, the designation "5u" indicates that the cell is physically realized as five different pairs of emitter degenerated transistors, each formed from unit sized components, connected in parallel. Likewise, current source 92B is shown as a single emitter degenerated transistor, but the designation "5u" indicates that the cell is physically realized as five different emitter degenerated transistors, each formed from unit sized components, connected in parallel.

The use of parallel unit cells enables the voltages at various points in the circuit (e.g., collector voltages, base voltages, etc.) to be maintained with a high level of accuracy, even as different numbers of cells are selectively enabled and disabled to change the overall gain of the amplifier. Each unit transistor and resistor in each current source has the same geometry and sees the same voltage, and therefore, contributes the same amount of current Likewise, each unit transistor and resistor pair in each input and output cell has the same geometry and sees the same voltage, and therefore, contributes the same amount transconductance (gm) to the cell. Therefore, the amount of current or transconductance contributed by each multi-unit cell is ratiometric with respect to the other cells; that is, the relative amount of current or transconductance switched in or out depends only on the number of cells and units within each cell.

Referring back to FIG. 13, shot noise from transistors Q27 and Q28 may be injected into nodes A and B and work into the input resistors $R_{IN}$, and any other source impedance coupled to the input, to generate a noise voltage that propagates to the output. Emitter degeneration resistors R27 and R28 are included in the load circuit to reduce this noise. In general, the greater the emitter degeneration voltage compared to the thermal voltage $V_T$, the lower the noise. However, as different numbers of input cells are switched in and out, the current through R27 and R28 may change dramatically, thereby causing large swings in the amount of degeneration voltage. If the degeneration resistors are sized to provide adequate degeneration voltage at high current levels, the degeneration voltage at lower current levels may be inadequate to suppress noise. Conversely, if the degeneration resistors are sized to provide adequate degeneration voltage at low current levels, the degeneration voltage may become excessive at high current levels.

Therefore, as a further elaboration, the system of FIG. 14 includes multiple load circuits 98A-98D that can also be selectively enabled and disabled in response to the coarse gain control signals C0-C2. As each input cell is switched on, the corresponding load cell is switched on to absorb the current from the input cell. This arrangement enables the degeneration voltage to remain constant, regardless of number of input cell that are enabled, thereby providing adequate noise reduction at all gain settings. As with the input and output cells, the load circuits are also implemented as a modular structure with parallel unit cells of emitter degenerated transistors to maintain constant operating voltages and good matching regardless of how many cells are enabled, and how many units are included in each cell.

Figure 16:
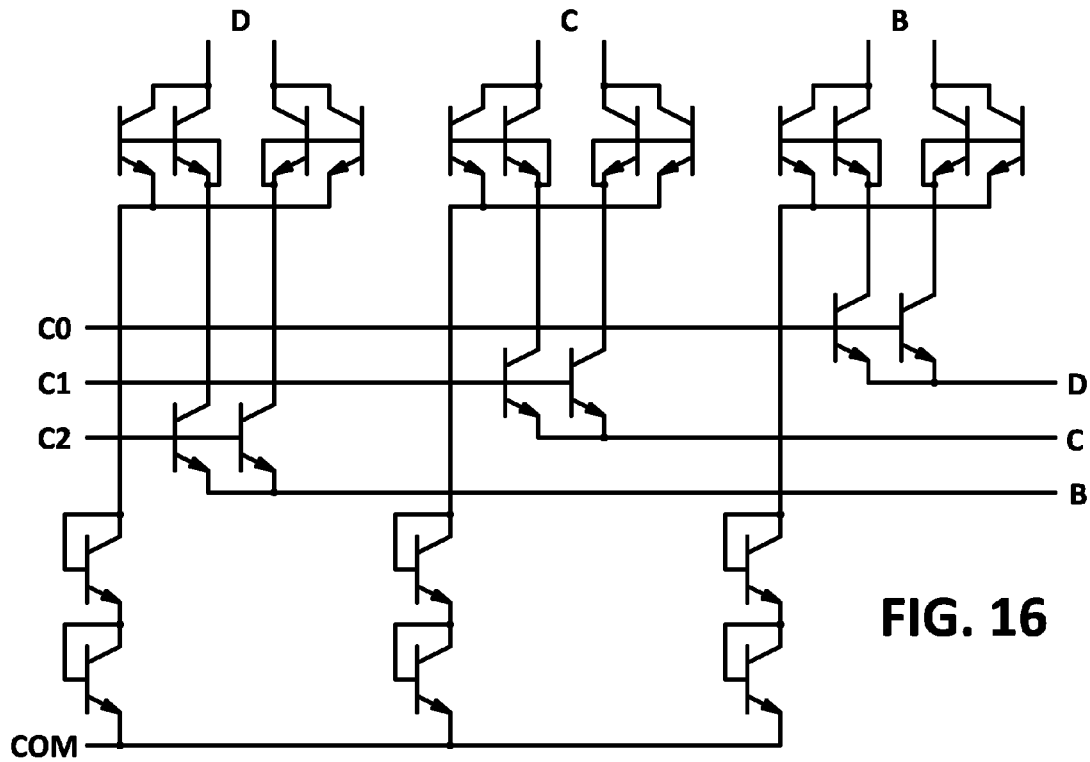
FIGS. 16-18 illustrate example embodiments of gain control circuits suitable for use with the embodiments of FIGS. 14 and 15 according to some of the inventive principles of this patent disclosure.

In this embodiment, the input cells are turned off by diverting the tail current from the corresponding current source through a gain control circuit 100 in response to the coarse gain control signals C0-C2. These currents could simply be diverted to a power supply when not in use. The gain control circuit, however, reuses these currents to turn off the corresponding load circuits. Each diverted current is split into pairs and applied to the emitters of the corresponding load transistors. This pulls down on the emitters, effectively shutting of the load transistors when the corresponding input cell is off. An example embodiment of a suitable gain control circuit is shown in FIG. 16.

To set the common-mode voltage at nodes A and B, a common-mode circuit including operational amplifier (op amp) 102 senses the midpoint voltage between nodes A and B through sense resistors R102A and R102B. The op amp 102 compares this midpoint voltage to a common mode reference voltage $V_{CM}$ and drives the bases of the transistors in the load circuits, thereby forming a servo-loop that maintains the common mode voltage of nodes A and B at $V_{CM}$.

In an alternative embodiment, the bases of the load transistors could be maintained at a bias voltage $V_{B2}$ that causes the load circuits to absorb a certain percentage, e.g., 80 percent, of the required current. The output of op amp 102 could then be arranged to drive an additional pair of transistors that absorb the remaining current to nodes A and B, thereby maintaining the input common mode voltage at $V_{CM}$.

The input signal $V_{IN}$ is applied to nodes A and B through input resistors $R_{IN}$. The servo amplifier 106 drives nodes C and D in response to the input at nodes A and B and with a transconductance that determined by the coarse gain control signals C0-C2.

Figure 17:
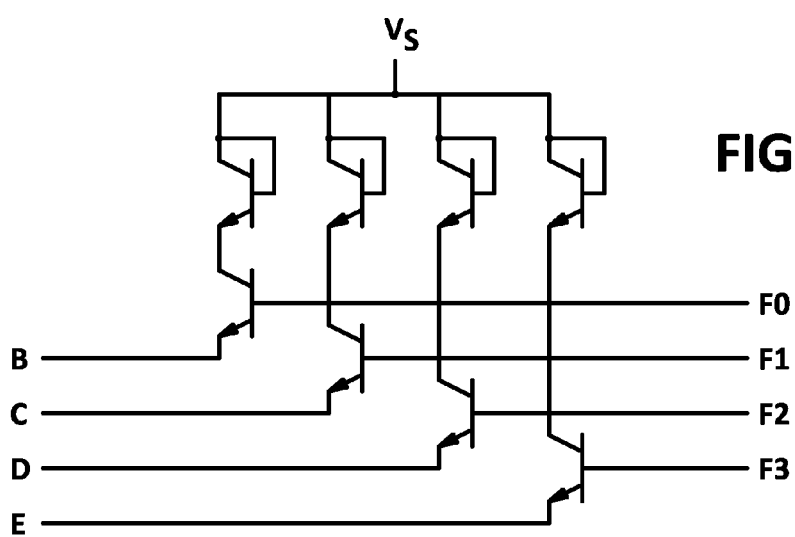

The output currents from output cells 94A-94E are summed at nodes G and H and applied to a transimpedance amplifier (TZA) 118 which converts the output currents to an output voltage $V_{OUT}$. Preferably, the TZA in arranged to maintain the nodes G and H at the same common mode voltage as nodes A and B. As with the input cells, the output cells are selectively disabled by diverting the tail current from the corresponding current source through a fine gain control circuit 104 in response to the fine gain control signals F0-F3. On the output side, however, the currents are simply diverted to the upper power supply rail $V_s$. A suitable embodiment of a fine gain control circuit is shown in FIG. 17.

The current sources 92 in the input section and 96 in the output section are all biased by a common bias voltage $V_{B1}$ to maintain matching between the input and output sections.

The input section is implemented with one input cell 90A and corresponding current source 92A that are always enabled, and the output section is implemented with one output cell 94A and corresponding current source 96A that are always enabled. This provides a defined gain if all the remaining cells are disabled. In this embodiment, the input section includes three additional input cells are arranged to provide coarse gain steps of 3 dB, and the output section includes four additional output cells to provide fine gain steps. The course gain control signals C0-C2 are preferably decoded using thermometer decoding where additional cells is successively turned on without turning of the other cells as the gain sweeps in one direction. The fine gain control signals are preferably decoded using binary decoding where each of the sixteen possible combinations of signals provides a unique amount of fine gain.

Figure 15:
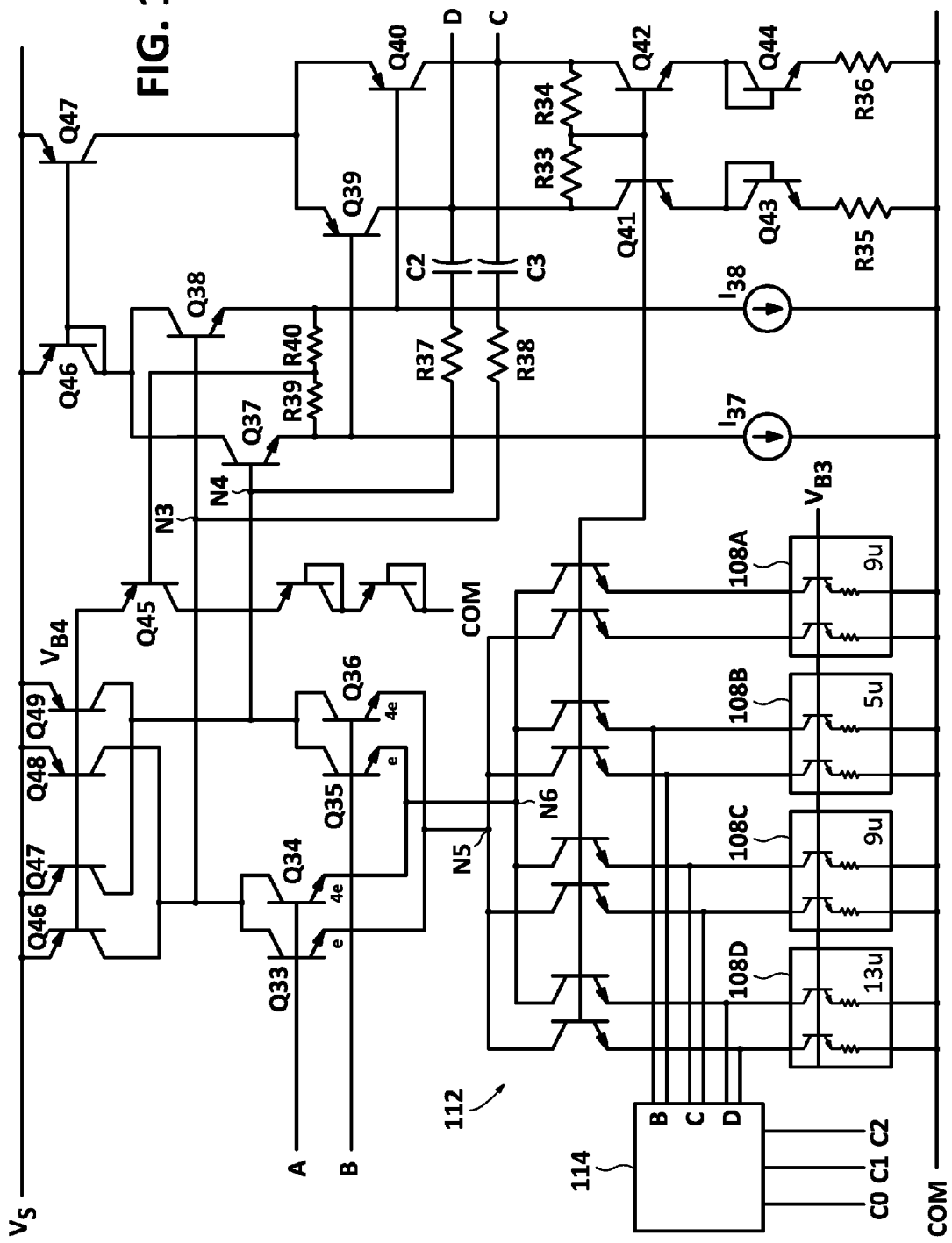
FIG. 15 illustrates an embodiment of a servo amplifier according to some of the inventive principles of this patent disclosure.

FIG. 15 illustrates an example embodiment of the servo (or loop) amplifier 106. The main signal flow is from nodes A and B through an input gm cell Q33-Q36, then through an emitter follower stage Q37,Q38, and finally through another gm cell Q39,Q40 to the output at nodes C and D.

Figure 18:
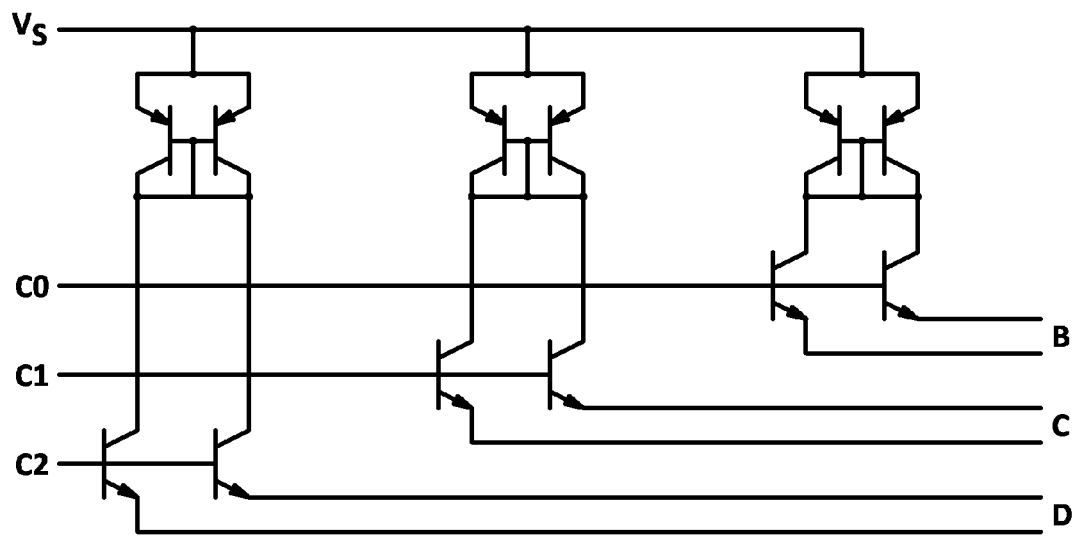

The input gm cell is arranged as a multi-tan h doublet with 4:1 emitter area ratios to provide a wide linear input range. The doublet is biased by selectable current sources 108A-108D through an array of cascode transistors 112. The current sources are implemented as parallel unit cells of emitter degenerated transistors, much like the current sources 92 and 96 in FIG. 14. The current sources are biased with a bias voltage $V_{B3}$ and selectively disabled by a servo gain control circuit 114 which diverts the current from unwanted current sources to the upper supply rail $V_s$ in response to the coarse gain control signals C0-C2. An example embodiment of a servo gain control circuit is shown in FIG. 18. The cascode transistors enable the current sources 108 to be disabled individually by the servo gain control circuit.

In this embodiment, constant loop gain is achieved by enabling and disabling the current sources 108 in the reverse order from the current sources 92 that supply the input cells. That is, as more input cells are enabled, more of the current sources 108 are disabled so the product of the total gm of the input section and the gm of the servo amp remains constant. The modular structure of the current sources using unit cells in both the input section and the servo amp enables precise control of the relative values of the input gm and the servo gm.

The multi-tan h input cell is loaded by current source transistors Q46-Q49. These transistors may optionally include emitter degeneration, either with conventional degeneration resistors or implemented with a switched modular architecture. In fact, such as scheme may even reuse currents diverted from the lower current sources 108 to turn off the upper current sources as is done in the input section. However, noise from the load transistors is typically not as problematic as noise from other sources, so emitter degeneration is left out of this embodiment.

The quiescent current through current source transistors Q46-Q49 is set by transistor Q45 which has its collector connected to the lower power supply rail COM through two diode-connected transistors. The base of Q45 is connected to the emitters of emitter-follower transistors Q37 and Q38 through resistors R39 and R40. This connection serves to define the voltage at the bases of Q37 and Q38.

The emitter-followers Q37 and Q38 are loaded by current sources $I_{37}$ and $I_{38}$ which also set the total quiescent current through Q46, which in turn forms a current mirror with Q47. Thus, the quiescent current is also reflected through Q47 as the tail current to the output gm cell Q39 and Q40 and may be ratioed through the emitter areas of Q46 and Q47.

The output gm cell Q39,Q40, which is arranged as an integrator, drives nodes C and D. The integration time constant is determined by R37 and C2, which are connected between node D and the base of Q37, and R38 and C3, which are connected between node C and the base of Q38.

The common mode voltage at nodes C and D is set by Q41 and Q42 and R33-R36 which are arranged in a configuration similar to that shown in FIG. 13B, but with an additional diode voltage drop introduced by Q43 and Q44. The value of resistors R35 and R36 is set to provide an voltage drop that matches the degeneration voltage in the input section. The connection at the bases of Q41 and Q42 also provides a convenient anchor point for the bases of cascode transistors 112.

Figure 19:
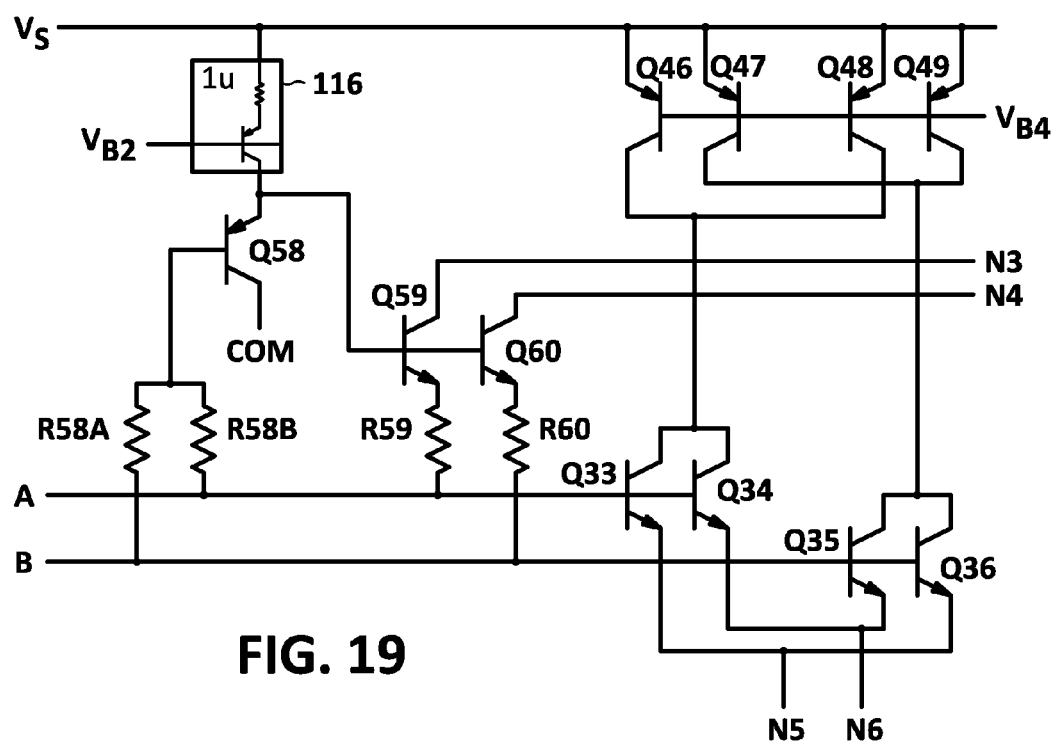
FIG. 19 illustrates an embodiment of circuitry to increase the slew rate at the input nodes of the servo amplifier of FIG. 15 at high-frequencies according to some of the inventive principles of this patent disclosure.

In yet another refinement, transistors Q59 and Q60 may be added at the input of the servo amp 106 as shown in FIG. 19 to improve the slew rate at high frequencies. The bases of Q59 and Q60 are connected to the output of a unit current source 116, which is similar to load circuits 98 and biased by the same bias voltage $V_{B2}$. Transistor Q58 samples the midpoint of nodes A and B through resistors R58A and R58B and pulls down on the output of current source 116 when the midpoint voltage falls.

Although the embodiments of FIGS. 14 and 15 include common mode circuits that position common mode voltage of the input nodes A and B and intermediate nodes C and D at predefined levels, the disclosed architecture enables the user to vary the input common mode voltage. This may be accomplished, e.g., by sourcing or sinking current through the input resistors $R_{IN}$ to set the input common mode voltage to any desired value. Due to the operation of the input common mode circuit, however, the common mode voltage at the input to the servo amp (nodes A and B) will remain at the common mode reference value $V_{CM}$, and the operation of the system will essentially be unaffected.

In a differential monolithic implementation, $C_{JC}$ cancellation transistors may be cross-connected with any transistors in the signal path, e.g., the input and output cells, input gm cell in the servo amp, etc., to balance any feed-forward caused by transistor capacitance. In addition, attention to layout details to preserve symmetry and cancel thermal gradients, doping gradients, etc., will also improve performance.

The inventive principles of this patent disclosure have been described above with reference to some specific example embodiments, but these embodiments can be modified in arrangement and detail without departing from the inventive concepts. For example, some embodiments have been illustrated with bipolar junction transistors (BJTs) of specific polarities, but BJTs of other polarities, as well as MOS and other types of transistors and devices may also be used. Thus, the terms collector, base and emitter are understood to also refer to corresponding terminals of other types of transistors and devices such as the drain, gate and source of a MOS transistor. As a further example, some input and output cells have been illustrated as simple differential pairs of transistors, but the terms "pair" and "differential pair" are also understood to include other types of transistor cells arranged to process differential signals, e.g., multi-tanh transistor cells which include more than two transistors but operate as a basic unit having differential inputs and/or outputs.

Additional examples are as follows. The input and output cells, current sources, and load circuits are described as being switched in certain manners, but other suitable techniques for selectively enabling and disabling input and/or output cells may also be effective. For example, MOS switches maybe used in series current sources in an arrangement sometimes referred to as "foot switches." Certain encoding schemes for controlling the gain are described, but other schemes may also be implemented in accordance with the inventive principles. Some embodiments have been illustrated as fully differential embodiments, but single-sided embodiments can also be implemented in accordance with the inventive principles. For example, some detailed embodiments of the input and output cells have been shown with differential pairs of transistors, but single-sided embodiments having cells with individual transistors or other forms of single-sided signal paths may also be constructed according to the inventive principles of this patent disclosure.

As a further example, the term gain can refer not only to a gain greater than one, but also to attenuation that provides gain changes through different amounts of attenuation. Since the embodiments described above can be modified in arrangement and detail without departing from the inventive concepts, such changes and modifications are considered to fall within the scope of the following claims.

The invention claimed is:

1. An amplifier comprising:
   an amplifier section having selectable signal paths constructed and arranged to provide discrete gain settings in response to selection signals; and
   logic coupled to the amplifier section and constructed and arranged to control the amplifier section to have discrete gain level steps by generating the selection signals to incrementally select the signal paths in discrete steps in response to an analog gain control signal;
   where the logic comprises a gain counter to generate a digital word to control selection signals to incrementally select the signal paths; and
   where the logic further comprises:
      a digital-to-analog converter (DAC) to convert the selection signals to an analog feedback signal; and
      a comparator to drive the gain counter in response to the analog feedback signal and the analog gain control signal.

2. The amplifier of claim 1 where the logic is configured to increment the gain in response to assertions of a first digital input and decrement the gain in response to assertions of a second digital signal.

3. The amplifier of claim 1 where the logic is configured to:
   increment the gain in response to an assertion of a clock signal when a direction signal is at a first logic level; and
   decrement the gain in response to an assertion of the clock signal when the direction signal is at a second logic level.

4. The amplifier of claim 1 where the logic is configured to:
   continuously increment the gain while a first digital signal is asserted; and
   continuously decrement the gain while a second digital signal is asserted.

5. The amplifier of claim 4 where the logic is configured to increment or decrement the gain at intervals determined by an internally generated clock signal.

6. The amplifier of claim 4 where the logic is configured to increment or decrement the gain at intervals determined by an external clock signal.

7. The amplifier of claim 1 where the logic includes an internal clock generator.

8. The amplifier of claim 7 where the logic is configured to disable the internal clock generator when the gain does not need to be incremented or decremented.

9. The amplifier of claim 1 where the logic is configured to incrementally select the signal paths in response to an analog gain control signal and a feedback signal that indicates the gain of the amplifier.

10. The amplifier of claim 1 where the comparator comprises:
    an error amplifier to generate an error signal in response to the analog feedback signal and the analog gain control signal; and
    a window comparator to compare the error, signal to high and low threshold levels.

11. The amplifier of claim 1 where the logic further comprises a decoder to generate some or all of the selection signals by decoding some or all of the digital word.

12. An amplifier comprising:
    an amplifier section haying selectable signal paths constructed and arranged to provide discrete gain settings in response to selection signals; and
    logic coupled to the amplifier section and constructed and arranged to control the amplifier section to have discrete gain level steps by generating the selection signals to incrementally select the signal paths in discrete steps;
    where the logic is configured to:
       begin continuously incrementing the gain in response to an edge of a first logic signal; and
       stop incrementing the gain in response to an edge of a second logic signal.

13. The amplifier of claim 12 where the logic is configured to:
    begin continuously decrementing the gain in response to an edge of the second logic signal; and
    stop decrementing the gain in response to an edge of the first logic signal.

* * * * *

UNITED STATES PATENT AND TRADEMARK OFFICE
CERTIFICATE OF CORRECTION

| | | |
|---|---|---|
| PATENT NO. | : 7,880,542 B1 | Page 1 of 1 |
| APPLICATION NO. | : 12/054192 | |
| DATED | : February 1, 2011 | |
| INVENTOR(S) | : Barrie Gilbert et al. | |

It is certified that error appears in the above-identified patent and that said Letters Patent is hereby corrected as shown below:

Column 8, line 58, the words "$I_{OUT}, I_{OUTM}$" should read -- $I_{OUTP}, I_{OUTM}$ --;

Column 9, lines 16-17, the words "multi-tan h" should read -- multi-tanh --;

Column 9, lines 18, the words "multi-tan h" should read -- multi-tanh --;

Column 9, lines 20, the words "multi-tan h" should read -- multi-tanh --;

Column 9, lines 21, the words "multi-tan h" should read -- multi-tanh --;

Column 10, line 27, the word "V" should read -- $V_{TL}$ --;

Column 11, line 32, the word "$V_s$" should read -- $V_S$ --;

Column 11, line 57, the word "$I_i$" should read -- $I_1$ --;

Column 12, line 22, the word "$V_i$," should read -- $V_1$ --;

Column 12, line 35, the word "$A_o$" should read -- $A_0$ --;

Column 12, line 36, the word "$V_i/A_o$" should read -- $A_0$ --;

Column 12, line 38, the word "$A_o$" should read -- $A_0$ --;

Column 12, line 46, the word "$A_o$" should read -- $A_0$ --;

Column 12, line 49, the word "$A_o$" should read -- $A_0$ --;

Column 12, line 50, the word "$\Delta V_{ID}/A_o$" should read -- $\Delta V_{CD}/A_0$ --;

Column 14, line 60, the word "$V_s$" should read -- $V_S$ --;

Column 15, line 19, the words "multi-tan h" should read -- multi-tanh --;

Column 15, line 28, the word "$V_s$" should read -- Vs --;

Column 15, line 42, the words "multi-tan h" should read -- multi-tanh --;

Column 18, line 29, the word "haying" should read -- having --.

Signed and Sealed this

Twentieth Day of September, 2011

David J. Kappos
*Director of the United States Patent and Trademark Office*